(12) United States Patent
Gu et al.

(10) Patent No.: US 10,347,531 B2
(45) Date of Patent: Jul. 9, 2019

(54) MIDDLE OF THE LINE (MOL) CONTACT FORMATION METHOD AND STRUCTURE

(71) Applicant: GLOBALFOUNDRIES INC., Grand Cayman (KY)

(72) Inventors: Sipeng Gu, Clifton Park, NY (US);
Xusheng Wu, Ballston Lake, NY (US);
Xinyuan Dou, Clifton Park, NY (US);
Xiaobo Chen, Rexford, NY (US);
Guoliang Zhu, Rexford, NY (US);
Wenhe Lin, Saratoga Springs, NY (US); Jeffrey Chee, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 86 days.

(21) Appl. No.: 15/438,828

(22) Filed: Feb. 22, 2017

(65) Prior Publication Data
US 2018/0240703 A1    Aug. 23, 2018

(51) Int. Cl.
*H01L 21/768* (2006.01)
*H01L 23/535* (2006.01)
*H01L 23/532* (2006.01)

(52) U.S. Cl.
CPC .... *H01L 21/76889* (2013.01); *H01L 21/7684* (2013.01); *H01L 21/76805* (2013.01);
(Continued)

(58) Field of Classification Search
CPC ......... H01L 21/76889; H01L 21/76805; H01L 21/7684; H01L 21/76895
See application file for complete search history.

(56) References Cited

U.S. PATENT DOCUMENTS 5,672,543 A    9/1997  Chang et al.
6,136,697 A    10/2000 Wu
(Continued)

OTHER PUBLICATIONS

G. Ramanath et al., "W deposition and titanium fluoride formation during WF6 reduction by Ti: Reaction path and mechanisms", Journal of Applied Physics, vol. 85, No. 3, Feb. 1, 1999, pp. 1961-1969.

(Continued)

*Primary Examiner* — Seahvosh Nikmanesh
(74) *Attorney, Agent, or Firm* — Gibb & Riley, LLC; Francois Pagette

(57) ABSTRACT

Disclosed are a method of forming an integrated circuit (IC) structure with robust metal plugs and the resulting IC structure. In the method, openings are formed in an interlayer dielectric layer to expose semiconductor device surfaces. The openings are lined with a two-layer liner, which includes conformal metal and barrier layers, and subsequently filled with a metal layer. However, instead of waiting until after the liner is formed to perform a silicidation anneal, as is conventionally done, the silicidation anneal is performed between deposition of the two liner layers. This is particularly useful because, as determined by the inventors, performing the silicidation anneal prior to depositing the conformal barrier layer prevents the formation of microcracks in the conformal barrier layer. Prevention of such microcracks, in turn, prevents any metal from the metal layer from protruding into the area between the two liner layers and/or completely through the liner.

20 Claims, 11 Drawing Sheets

(52) U.S. Cl.
CPC .. *H01L 21/76814* (2013.01); *H01L 21/76846* (2013.01); *H01L 21/76864* (2013.01); *H01L 21/76895* (2013.01); *H01L 23/535* (2013.01); *H01L 23/53266* (2013.01)

(56) References Cited

U.S. PATENT DOCUMENTS

| | | |
|---|---|---|
| 6,413,853 B2 | 7/2002 | Jang et al. |
| 6,787,914 B2 | 9/2004 | Fortin |
| 7,160,803 B2 | 1/2007 | Kim et al. |
| 7,709,376 B2 | 5/2010 | Matsuyama et al. |
| 8,415,253 B2 | 4/2013 | Adam et al. |
| 2016/0043035 A1* | 2/2016 | Lin ................... H01L 21/76802 257/751 |

OTHER PUBLICATIONS

J.G. Wang et al., "Origin of tensile stress in the Si subtrate induced by TiN/HfO2 metal gate/high-k dielectric gate stack", AIP, Lett. 93, 2008, pp. 161913-1-161913-3.

Liqiang Zhang et al., "Microstructure, residual stress, and fracture of sputtered TiN films", Surface & Coatings Technology, 224, 2013, pp. 120-125.

* cited by examiner

MIDDLE OF THE LINE (MOL) CONTACT FORMATION METHOD AND STRUCTURE

BACKGROUND

Field of the Invention

The present invention relates to middle of the line (MOL) contacts and methods of forming MOL contacts so as to avoid defects.

Description of Related Art

Integrated circuit (IC) structures have middle of the line (MOL) contacts that connect semiconductor devices (e.g., field effect transistors (FETs), bipolar junction transistors (BJTs), heterojunction bipolar transistors (BJTs), capacitors, diodes, resistors, etc.) to back end of the line (BEOL) metal levels. For example, for FETs, the MOL contacts include at least one gate contact (also referred to herein as a CB contact), source/drain contacts (also referred to herein as CA contacts) and metal plugs (also referred to herein as TS contacts). Each gate contact extends essentially vertically through interlayer dielectric (ILD) material from a metal wire or via in a BEOL metal level to the gate of the FET. Each source/drain contact extends vertically through the ILD material from a metal wire or via in a BEOL metal level to a metal plug (e.g., a tungsten (W) plug), which contacts a source/drain region of the FET. Unfortunately, current MOL processing techniques used to form W plugs on semiconductor device surfaces, such as the source/drain region surfaces of a FET, often result in the formation of defects that can lead to a device failure. Therefore, there is a need in the art for a method of forming more robust metal plugs.

SUMMARY

In view of the foregoing, disclosed herein is a method of forming an integrated circuit (IC) structure with robust middle of the line (MOL) contacts and, particularly, robust metal plugs. Specifically, in the method, openings for the metal plugs are formed through an interlayer dielectric (ILD) layer to expose semiconductor device surfaces. The openings are lined with a two-layer liner, which includes a conformal metal layer (e.g., a conformal titanium layer) and a conformal barrier layer (e.g., a conformal titanium nitride layer), and subsequently filled with a metal layer. However, instead of waiting until after the liner is formed to perform a silicidation anneal to form silicide layers within the openings at the semiconductor device surface-metal plug interfaces, as is conventionally done, the silicidation anneal is performed between deposition of the two liner layers. The order in which the silicidation anneal is performed is particularly useful because, as determined by the inventors and as described in greater detail in the detailed description section, forming the conformal barrier layer after the silicidation anneal prevents the formation of microcracks in the conformal barrier layer. Prevention of such microcracks, in turn, prevents any metal from the metal layer from protruding into the area between the two layers of the liner and/or from protruding completely through the multi-layer liner. Also disclosed herein is an IC structure formed according to the disclosed method.

More particularly, disclosed herein is a method of forming an integrated circuit (IC) structure with a robust middle of the line (MOL) contact and, particularly, a robust metal plug. In the method, an opening for a metal plug can be formed in an interlayer dielectric (ILD) layer such that it extends essentially vertically through the ILD to a semiconductor device surface to be contacted. The semiconductor device surface can be made of a silicon-based semiconductor material (e.g., silicon, silicon germanium, silicon carbide, polysilicon, etc.).

To form the metal plug, a first conformal layer (e.g., a conformal metal layer) can be deposited so as to line the opening and, specifically, so as to be positioned immediately adjacent to the sidewalls of the opening and the semiconductor device surface at the bottom of the opening. Next, an anneal process can be performed to form a silicide layer within the opening at the interface between the semiconductor device surface and the first conformal layer. It should be noted that this anneal process can also cause a chemical reaction between the material of the first conformal layer and the material of any areas of contaminate residue on the semiconductor device surface, thereby creating bump(s) in the first conformal layer. After the anneal process is performed, a second conformal layer (e.g., a conformal barrier layer) can be deposited immediately adjacent to the first conformal layer, thereby forming a multi-layer liner in the opening. Following formation of the multi-layer liner, a metal layer can be deposited immediately adjacent to the second conformal layer to fill the opening. A polishing process (e.g., a chemical mechanical polishing (CMP) process) can be performed to remove the materials of the first conformal layer, the second conformal layer and the metal layer from above the ILD layer, thereby completing formation of a metal plug within the opening.

One specific embodiment of the method disclosed herein can be used to form an IC structure with a robust metal plug on the source/drain region of a field effect transistor (FET). In this embodiment of the method, an opening can be formed in an interlayer dielectric (ILD) layer. The opening can extend essentially vertically through the ILD layer to the top surface of a source/drain region of a previously formed FET. The source/drain region can be made of a silicon-based semiconductor material (e.g., silicon, silicon germanium, silicon carbide, or any other suitable silicon-based semiconductor material).

To form the metal plug, a first conformal layer (e.g., a conformal metal layer, such as a conformal titanium layer) can be deposited so as to line the opening and, specifically, so as to be positioned immediately adjacent to the sidewalls of the opening and immediately adjacent to the top surface of the source/drain region at the bottom of the opening. Next, an anneal process can be performed to form a silicide layer (e.g., a titanium silicide layer) within the opening at the interface between the source/drain region and the first conformal layer. It should be noted that this anneal process can also cause a chemical reaction between the titanium material of the first conformal layer and the fluoride material of any areas of fluoride residue on the top surface of the source/drain region, creating bump(s) in the titanium layer with each bump corresponding to a relatively thick titanium trifluoride region. After the anneal process is performed, a second conformal layer (e.g., a conformal barrier layer, such as a conformal titanium nitride layer) can be deposited immediately adjacent to the first conformal layer, thereby forming a multi-layer liner in each opening. Following formation of the multi-layer liner, a metal layer (e.g., a tungsten layer) can be deposited immediately adjacent to the second conformal layer to fill the opening. A polishing process (e.g., a chemical mechanical polishing (CMP) process) can be performed to remove the materials of the first conformal layer, the second conformal layer and the metal layer from above the ILD layer, thereby completing formation of a metal plug within the opening on the source/drain region.

Also disclosed herein is an integrated circuit (IC) structure with at least one robust middle of the line (MOL) contact and, particularly, at least one robust metal plug. The IC device can include at least one semiconductor device (e.g., a field effect transistor (FET) or other semiconductor device). An interlayer dielectric (ILD) layer can cover the semiconductor device. An opening can extend essentially vertically through the ILD layer to a surface of the semiconductor device (e.g., to a source/drain region of a FET). This surface can specifically be made of a silicon-based semiconductor material (e.g., silicon, silicon germanium, silicon carbide, polysilicon, etc.).

A metal plug can fill the opening. The metal plug can include a first conformal layer (e.g., a conformal metal layer, such as a conformal titanium layer), which lines the opening and, particularly, which is immediately adjacent to the sidewalls of the opening and also above and immediately adjacent to the semiconductor device surface at the bottom of the opening. The first conformal layer can further have at least one relatively thick region, which forms a bump in the first conformal layer above the semiconductor device surface. The metal plug can further include a second conformal layer (e.g., a conformal barrier layer, such as a conformal titanium nitride layer) immediately adjacent to the first conformal layer. The first conformal layer and the second conformal layer can, thus, form a multi-layer liner that lines the opening. The metal plug can further include a metal layer (e.g., a tungsten layer) immediately adjacent to the second conformal layer and filling the opening.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, integrated circuit (IC) structures have middle of the line (MOL) contacts that connect semiconductor devices (e.g., field effect transistors (FETs), bipolar junction transistors (BJTs), heterojunction bipolar transistors (BJTs), capacitors, diodes, resistors, etc.) to back end of the line (BEOL) metal levels. For example, for FETs, the MOL contacts include at least one gate contact (also referred to herein as a CB contact), source/drain contacts (also referred to herein as CA contacts) and metal plugs (also referred to herein as TS contacts). Each gate contact extends essentially vertically through interlayer dielectric (ILD) material from a metal wire or via in a BEOL metal level to the gate of the FET. Each source/drain contact extends vertically through the ILD material from a metal wire or via in a BEOL metal level to a metal plug (e.g., a tungsten plug), which contacts a source/drain region of the FET.

Figure 10:
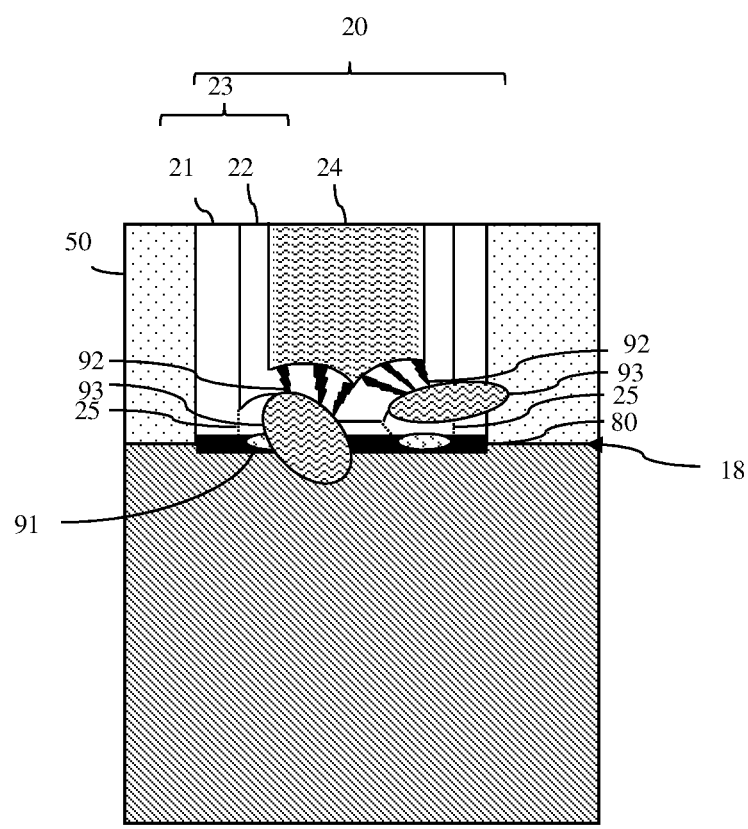
FIG. 10 is a cross-section diagram illustrating an enlarged view of a defective metal plug.

Current MOL processing techniques used to form tungsten plugs on silicon-based semiconductor device surfaces (e.g., on silicon-based source/drain region surfaces of a FET) often result in defects that can lead to device failures. Specifically, to form a tungsten plug during conventional MOL processing, a plug opening is patterned and etched into an interlayer dielectric (ILD) layer 50 to expose the semiconductor device surface 18 to be contacted (see FIG. 10). Multiple relatively thin layers including, for example, a titanium layer 21 and a titanium nitride layer 22, are conformally deposited so as to line the plug opening with a multi-layer liner 23. After the multi-layer liner 23 is formed, a rapid thermal silicidation (RTS) anneal is performed to create a silicide layer 80 at the interface between the semiconductor device surface 18 and the multi-layer liner 23. Immediately following the silicidation anneal, a tungsten layer 24 is deposited so as to fill any remaining space within the plug opening, thereby forming the tungsten plug 20. However, during deposition of the tungsten layer 24, relatively large tungsten deposits 93 inevitably form between the layers of the multi-layer liner 23 and/or between the semiconductor device surface 18 and the multi-layer liner 23. This phenomenon is referred to as a tungsten volcano, which can lead to shorts between device components and/or shorts with other device(s). Thus, this phenomenon can lead to device failures.

The present inventors have investigated these tungsten volcanoes and have determined that the cause is two-fold.

First, microcracks 92, which develop within the titanium nitride layer 22 prior to deposition of the tungsten layer 24, provide a path for the tungsten to protrude through. The inventors have determined that these microcracks 92 in the titanium nitride layer 22 develop during the silicidation anneal. Specifically, surface treatments performed before interlayer dielectric (ILD) layer 50 deposition and/or before titanium layer 21 deposition remove oxides from the semiconductor device surface 18. However, the surface treatments appear to leave behind a contaminate residue 91 (e.g., a fluoride residue). During the silicidation anneal, fluoride from the contaminate residue 91 on the semiconductor device surface 18 immediately adjacent to the titanium layer 21 reacts with the titanium layer 21. This reaction produces a titanium trifluoride region within the titanium layer 21 above the residue 91 and the titanium trifluoride region is relatively thick as compared to the rest of the titanium layer 21, thereby creating a bump 25 within the titanium layer 21. As bump(s) 25 are created within the titanium layer 21, stress is imparted on the titanium nitride layer 22 above causing the development of the microcracks 92. As mentioned above, microcracks 92 in the titanium nitride layer 22 provide a path for the tungsten to protrude through.

Second, a precursor used during tungsten deposition erodes away the titanium layer providing space for the tungsten deposits below the titanium nitride layer 22. Specifically, tungsten is typically deposited by chemical vapor deposition (CVD) using tungsten hexafluoride gas. During tungsten deposition, the tungsten hexafluoride gas flows through the microcracks 92 and reacts with the titanium below, producing titanium tetrafluoride gas that flows back out through the microcracks 92. As a result of this reaction, the titanium layer 21 is eroded away and leaving voids between the layers of the multi-layer liner 23 and/or between the semiconductor device surface 18 and the liner 23 within which relatively large tungsten deposits 93 may form. Filling of the voids with tungsten can lead to shorts and can impart stress on the adjacent semiconductor device material.

In view of the foregoing, disclosed herein is a method of forming an integrated circuit (IC) structure with robust middle of the line (MOL) contacts and, particularly, robust metal plugs. Specifically, in the method, openings for the metal plugs are formed through an interlayer dielectric (ILD) layer to expose semiconductor device surfaces. The openings are lined with a two-layer liner, which includes a conformal metal layer (e.g., a conformal titanium layer) and a conformal barrier layer (e.g., a conformal titanium nitride layer), and subsequently filled with a metal layer. However, instead of waiting until after the liner is formed to perform a silicidation anneal to form silicide layers within the openings at the semiconductor device surface-metal plug interfaces, as is conventionally done, the silicidation anneal is performed between deposition of the two liner layers. The order in which the silicidation anneal is performed is particularly useful because, as determined by the inventors and as described in greater detail in the detailed description section, forming the conformal barrier layer after the silicidation anneal prevents the formation of microcracks in the conformal barrier layer. Prevention of such microcracks, in turn, prevents any metal from the metal layer from protruding into the area between the two layers of the liner and/or from protruding completely through the multi-layer liner. Also disclosed herein is an IC structure formed according to the disclosed method.

Figure 1:
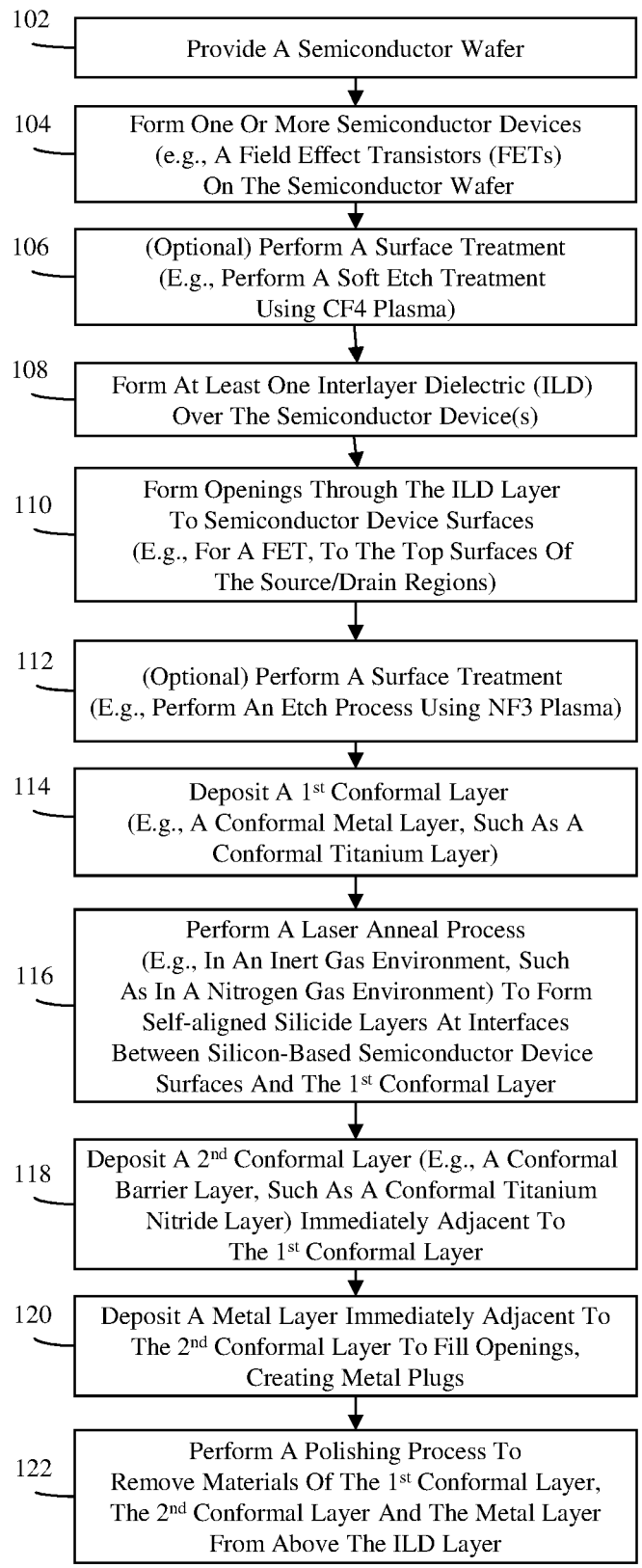
FIG. 1 is a flow diagram illustrating a disclosed method of forming an integrated circuit (IC) structure with robust metal plugs.

More particularly, referring to the flow diagram of FIG. 1, disclosed herein are embodiments of a method of forming an integrated circuit (IC) structure with robust middle of the line (MOL) contacts and, particularly, with robust metal plugs such as robust tungsten plugs.

Figure 2:
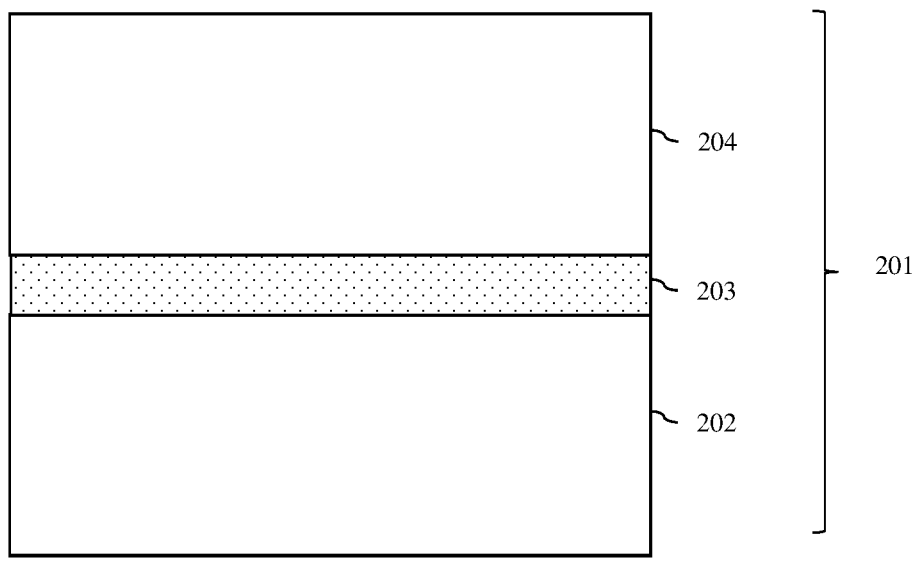
FIGS. 2-8 are cross-section diagrams illustrating partially completed integrated circuit structures formed according to the flow diagram of FIG. 1.

In the method, a semiconductor wafer is provided (102, see FIG. 2). The semiconductor wafer 201 provided at process 102 can be, for example, a semiconductor-on-insulator wafer (e.g., a silicon-on-insulator (SOI) wafer) that includes a substrate 202 (e.g., a silicon substrate), an insulator layer 203 (e.g., a buried oxide (BOX) layer or other suitable insulator layer on the semiconductor substrate) and a semiconductor layer 204 (e.g., a silicon layer or other suitable semiconductor layer) on the insulator layer 203. Alternatively, a bulk semiconductor wafer (e.g., a bulk silicon wafer or other suitable bulk semiconductor wafer) could be provided.

Figure 3:
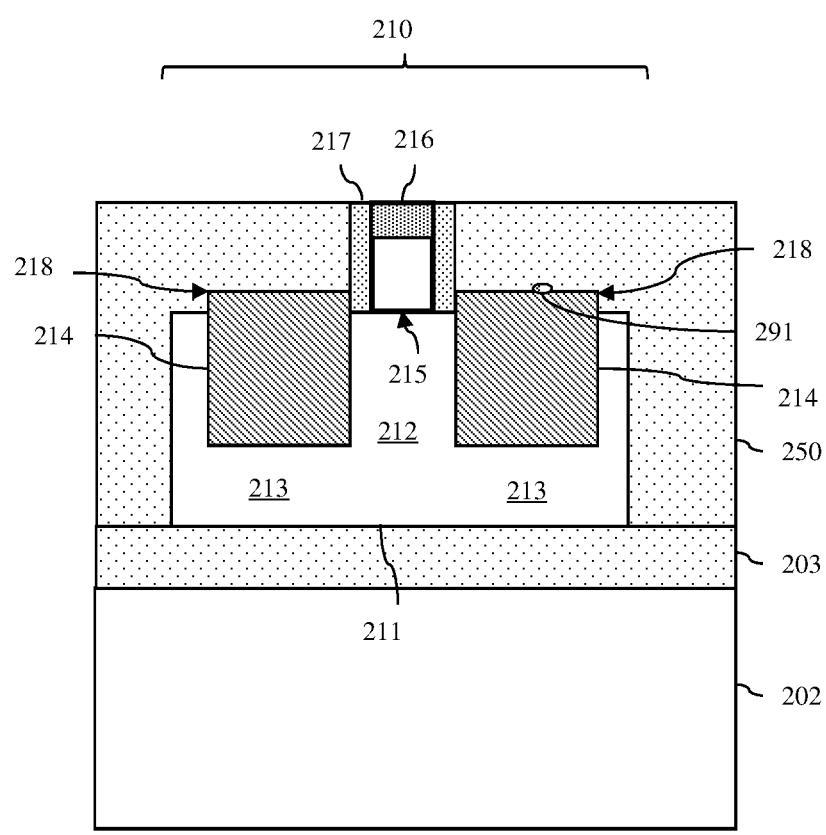

One or more semiconductor devices 210 can be formed on the semiconductor wafer 201 (104, see FIG. 3). The device (s) can include, but are not limited to, any of the following: one or more field effect transistors (FETs), one or more bipolar junction transistors (BJTs), one or more heterojunction bipolar transistors (HBTs), one or more diodes, one or more capacitors, and/or one or more resistors. For purposes of illustration, an exemplary embodiment of the method is described below and illustrated in the figures with respect to the formation of a FET and, particularly, a non-planar FET, such as a fin-type FET (i.e., a FINFET).

Those skilled in the art will recognize that generally a FINFET will include a semiconductor fin 211 (i.e., an elongated essentially rectangular shaped semiconductor body). A FINFET will further include the following: a channel region 212 within the semiconductor fin 211; a gate 215 adjacent to the semiconductor fin 211 at the channel region 212; a dielectric gate cap 216 above the gate 215; a dielectric gate sidewall spacer 217 positioned laterally adjacent to the sidewalls of the gate 215; and source/drain regions 214, which are within portions 213 of the semiconductor fin 211 that extend laterally beyond the gate 215 such that the channel region 212 is positioned laterally between the source/drain regions 214. The gate 215 can be a gate first gate structure. Alternatively, the gate can be a sacrificial gate structure that will subsequently be replaced with a replacement metal gate structure. Optionally, the source/drain regions 214 can be raised epitaxial source/drain regions. That is, the semiconductor fin 211 can further have source/drain trenches on opposing sides of the channel region 212 and the source/drain trenches can be filled with an epitaxial semiconductor material. The epitaxial semiconductor material can be a different semiconductor material than that used for the semiconductor fin 211. For example, both the semiconductor material of the semiconductor fin 211 and the epitaxial semiconductor material of the raised epitaxial source/drain regions 214 can be silicon-based semiconductor materials, but they can be different silicon-based semiconductor materials. For example, the semiconductor material of the semiconductor fin 211 can be silicon and the epitaxial semiconductor material of the raised epitaxial source/drain regions 214 can be silicon germanium (e.g., for a p-type FET) or silicon carbide (e.g., for an n-type FET). Techniques for forming FETs and FINFETs are well known in the art and, thus, the details of the techniques have been omitted in order to allow the reader to focus on the salient aspects of the disclosed method.

In this exemplary embodiment of the method, the top surfaces 218 of the raised epitaxial source/drain regions 214 are two semiconductor device surfaces to be contacted by metal plugs. Again, it should be understood that the FINFET device described above and illustrated in the figures is just one example of a semiconductor device that can be formed on the semiconductor wafer at process 104 and that can have at least one semiconductor device surface to be contacted by a metal plug. In any case, the semiconductor device surface (s) to be contacted can be made of a silicon-based semiconductor material (e.g., silicon, silicon germanium, silicon carbide, polysilicon, etc.).

Optionally, after a semiconductor device 210 is formed at process 104, a surface treatment can be performed (106). The surface treatment can be, for example, a soft etch treatment used to clean and, particularly, to remove oxides from the top surfaces 218 of semiconductor device regions 214. One exemplary soft etch treatment that can be used at process 106 is a tetrafluoromethane plasma etch process. While such a soft etch treatment may remove oxides from top surfaces 218 of the semiconductor devices regions 214, the etchant used may leave behind a contaminate residue 291. For example, although a tetrafluoromethane plasma etch process may remove oxides from the top surfaces 218 of the semiconductor device regions 214, the inventors have noted that a fluoride residue 291 may remain on one or more areas.

One or more interlayer dielectric (ILD) layers can be formed over the semiconductor device 210 (108). For example, a blanket ILD layer 250 can be deposited so as to cover the top surfaces 218 of the semiconductor device regions 214. The blanket ILD layer 250 can be, for example, a blanket silicon dioxide layer or a blanket layer of some other suitable ILD material, such as borophosphosilicate glass (BPSG), tetraethyl orthosilicate (TEOS), fluorinated tetraethyl orthosilicate (FTEOS), etc. Those skilled in the art will recognize that, if a FINFET with a replacement metal gate structure as opposed to a gate first gate structure is being formed, after the ILD layer 250 is deposited, it will be polished (e.g., using a chemical mechanical polishing (CMP) process) to expose the top of a previously formed sacrificial gate structure. The sacrificial gate structure will then be selectively removed to create a gate opening in the ILD layer 250 and a replacement metal gate will be formed within the gate opening adjacent to channel region 212.

Figure 4:
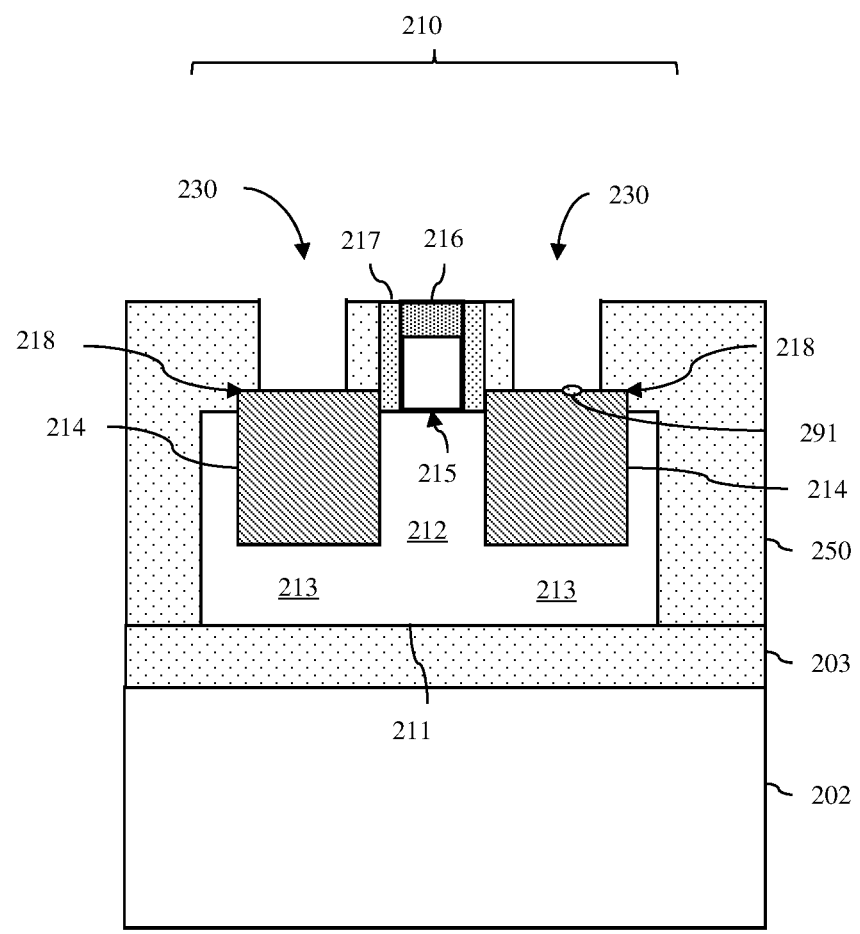

Next, openings 230 can be formed (e.g., lithographically patterned and etched) such that each opening 230 extends essentially vertically through the ILD layer 250 to the top surface 218 of a semiconductor device region 214 to be contacted (110, see FIG. 4). In the case of a FINFET, the openings 230 can be formed (e.g., lithographically patterned and etched) so that they extend essentially vertically to the top surfaces of the source/drain regions.

Figure 5:
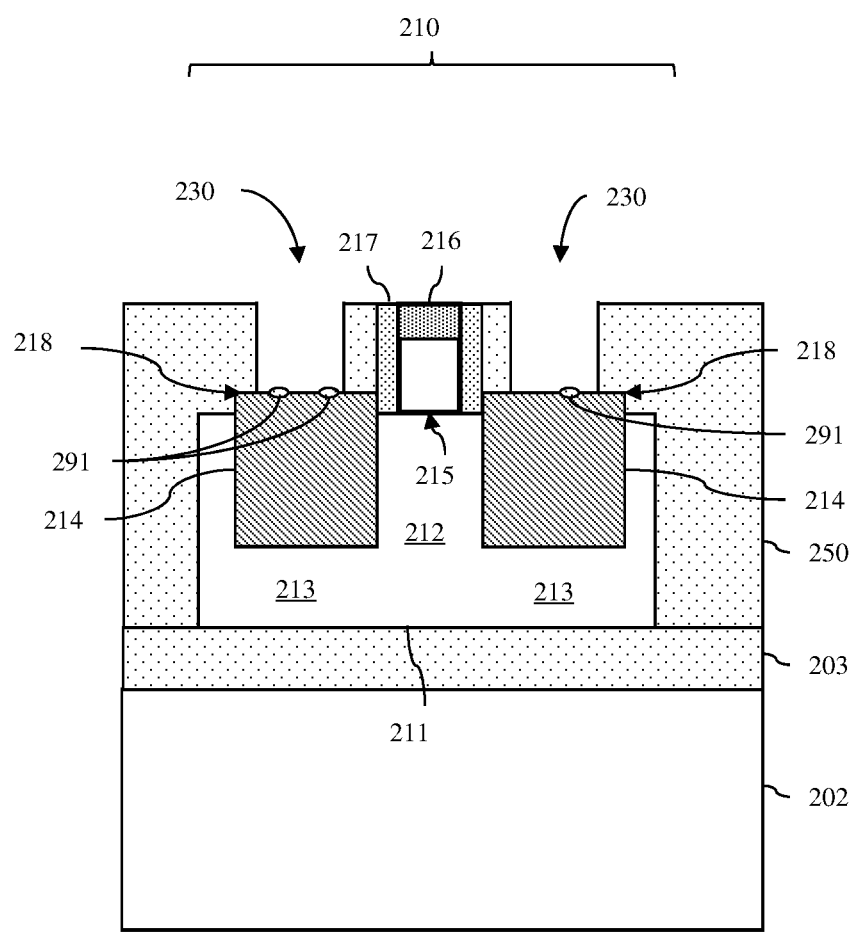

Optionally, after the openings 230 are formed, a surface treatment can be performed. The surface treatment can be, for example, a pre-cleaning etch treatment used to clean and, particularly, to remove oxides from the exposed top surfaces 218 of semiconductor device regions 214 within the openings 230 immediately prior to metal plug formation. One exemplary pre-cleaning etch treatment employs a dry chemical etch process using a nitrogen trifluoride/ammonium etchant. While the etchant removes oxides from top surfaces 218 of the semiconductor devices regions 214, contaminate residue 291 (e.g., fluoride residue) may be left behind on or more areas (112, see FIG. 5).

Figure 6:
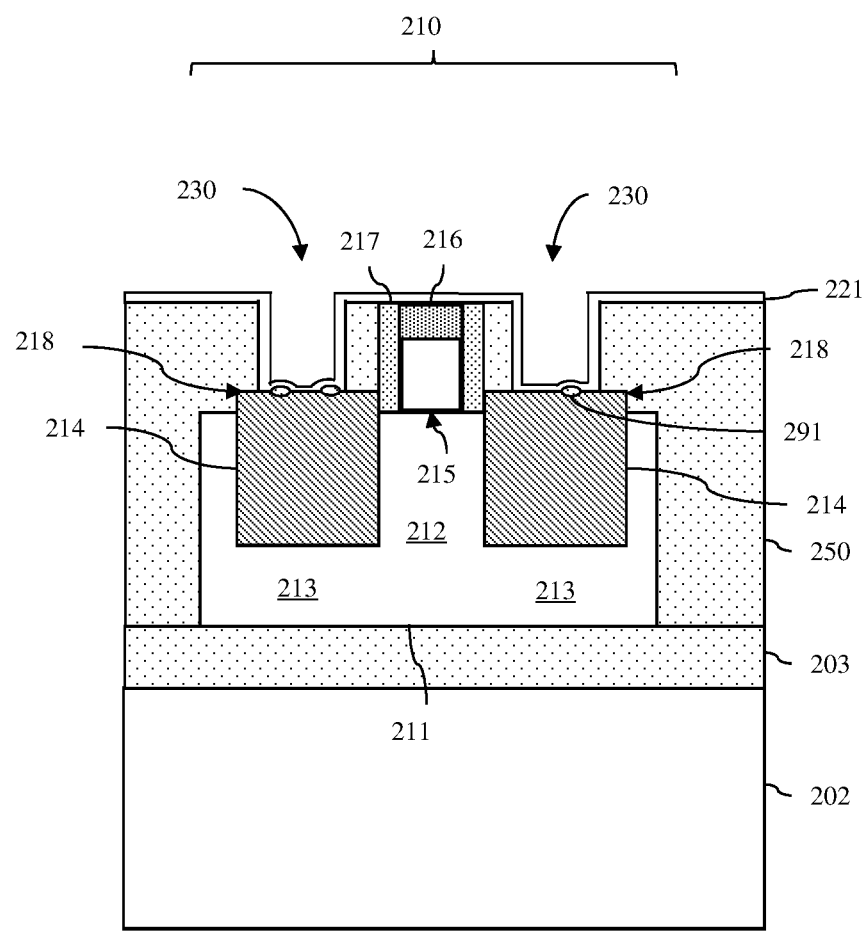

To form metal plugs, a first conformal layer 221 can be deposited so as to line each opening 230 and, specifically, so as to be positioned immediately adjacent to the sidewalls of each opening 230 as well as above and immediately adjacent to the exposed portion of the semiconductor device surface 218 at the bottom of each opening 230 (114, see FIG. 6). The first conformal layer can be, for example, a conformal metal layer. Such a conformal metal layer can be deposited, for example, using a physical vapor deposition (PVD) process or any other deposition process suitable for essentially conformally depositing a metal material to line each opening 230. In a preferred embodiment, the first conformal layer 221 can be a conformal titanium layer. Alternatively, the first conformal layer 221 can be made of any other metal suitable for silicide formation. For example, the first conformal layer 221 could be a conformal tantalum layer, a conformal ruthenium layer, a conformal cobalt layer or any a conformal layer of any other metal suitable for silicide formation. It should be noted that this first conformal layer 221 will be above and immediately adjacent to any contaminate residue 291 (e.g., any fluoride residue) present on the exposed portion of the semiconductor device surface 218 at the bottom of each opening 230.

Figure 7:
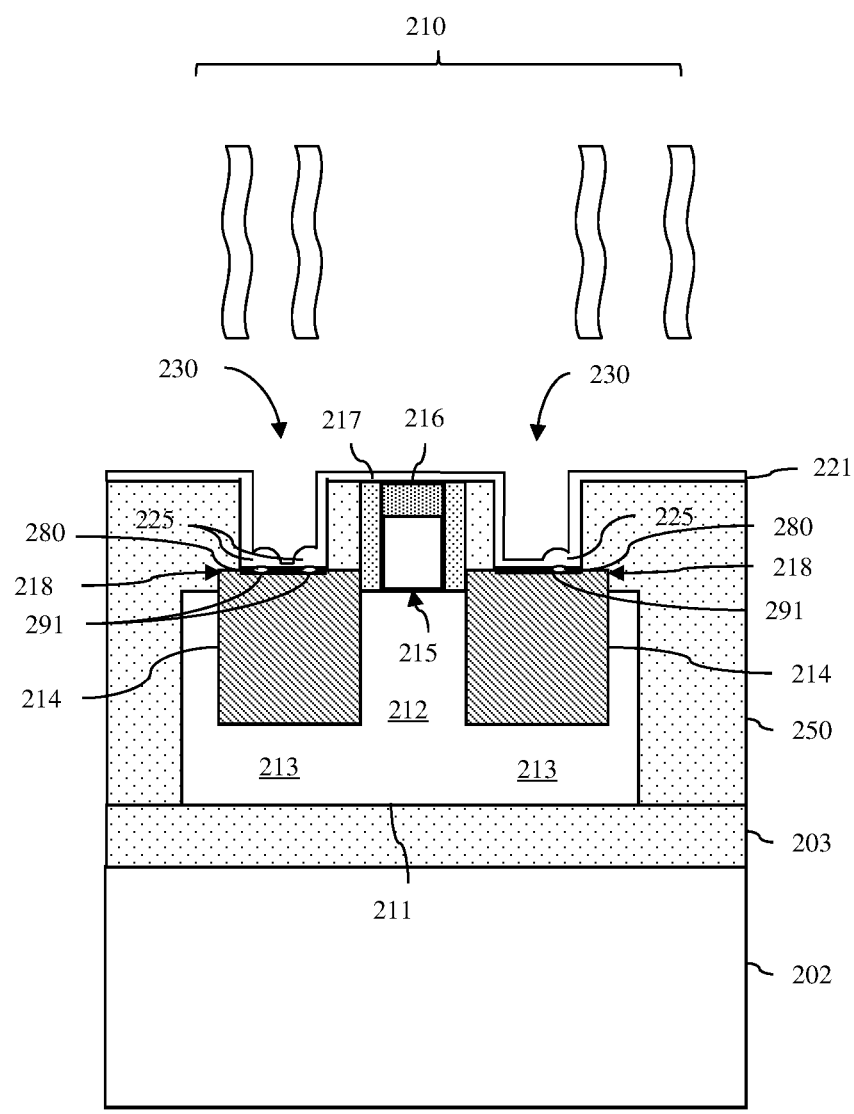

Following deposition of the first conformal layer 221 and prior to deposition of any additional layers, an anneal process can be performed to form a silicide layer 280 within each openings 230 at the interface between the semiconductor device surface 218 and the first conformal layer 221 (116, see FIG. 7). For example, when the first conformal layer 221 is a conformal titanium layer, the anneal process can form a titanium silicide layer. If the first conformal layer 221 is a conformal tantalum layer, the anneal process can form a tantalum silicide layer, and so on. It should be noted that this anneal process can also cause a chemical reaction between the material of the first conformal layer 221 and the immediately adjacent material of the contaminate residue 291 on the semiconductor device surface 218 and, depending upon the materials, may create thick portion(s) (i.e., bump(s) 225) in the first conformal layer 221, wherein the bump(s) 225 are aligned above the contaminate residue 291, are laterally surrounded by thin portions(s) and are made of a compound of the material of the first conformal layer (e.g., a metal) and the material of the contaminate residue (e.g., a fluoride residue). For example, when the material of the first conformal layer 221 is titanium and the material of the contaminate residue 291 is a fluoride, the anneal process will cause a chemical reaction and this chemical reaction will form relatively thick titanium trifluoride regions aligned above areas with the fluoride residue 291, thereby creating bumps 225 in the conformal titanium layer 221. The above described anneal process can be, for example, a laser anneal process. Optionally, this laser anneal process can be performed in an inert gas environment to remove any oxide material formed on the first conformal layer 221. For example, the laser anneal could be performed in a nitrogen gas environment, an argon gas environment, or any other inert gas environment suitable for removing oxides from the top surface of the first conformal layer 221.

Figure 8:
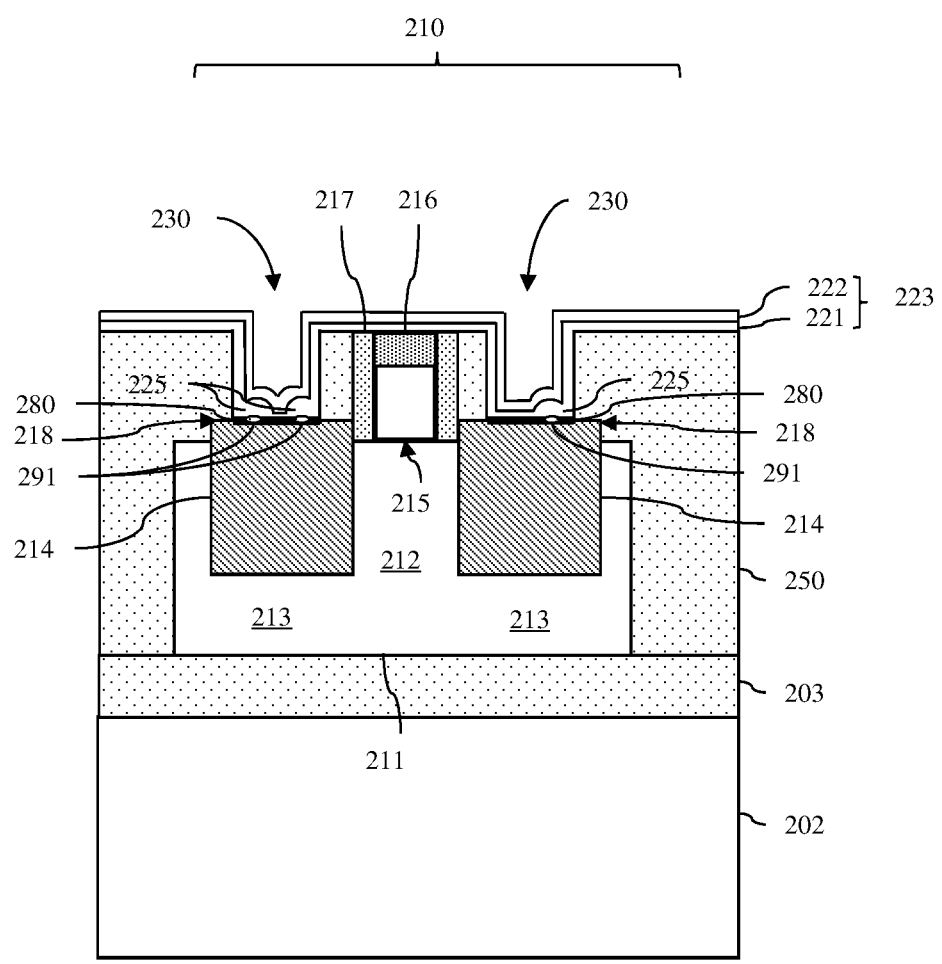

After the anneal process is performed, a second conformal layer 222 can be deposited immediately adjacent to the first conformal layer 221, thereby forming a multi-layer liner 223 and, particularly, a two-layer liner in each opening 230 (118, see FIG. 8). The second conformal layer 222 can be, for example, a conformal barrier layer. Such a conformal barrier layer can be deposited, for example, using an atomic layer deposition (ALD) process or any other deposition process suitable for essentially conformally depositing a metal material to line each opening 230. In a preferred embodiment, the second conformal layer 221 can be a conformal titanium nitride layer. Alternatively, the second conformal layer 222 could be a conformal tantalum nitride layer, a conformal tungsten nitride layer, or any other conformal layer of a suitable barrier material. Forming this second conformal layer 222 by ALD only after the anneal is performed at process 116 avoids the formation of any microcracks which would otherwise occur within the second conformal layer 222. That is, if the second conformal layer 222 was deposited onto the first conformal layer 221 before the anneal was performed, creation of the above-mentioned bump(s) 225 within the first conformal layer 221 during the anneal would impart stress on the second conformal layer 222 and cause microcracks. However, since, in the method disclosed herein, the second conformal layer 22 is only formed after the anneal is performed at process 116, the bump(s) 225 do not impart stress on the second conformal layer 222 and the formation of microcracks is avoided.

Figure 9A:
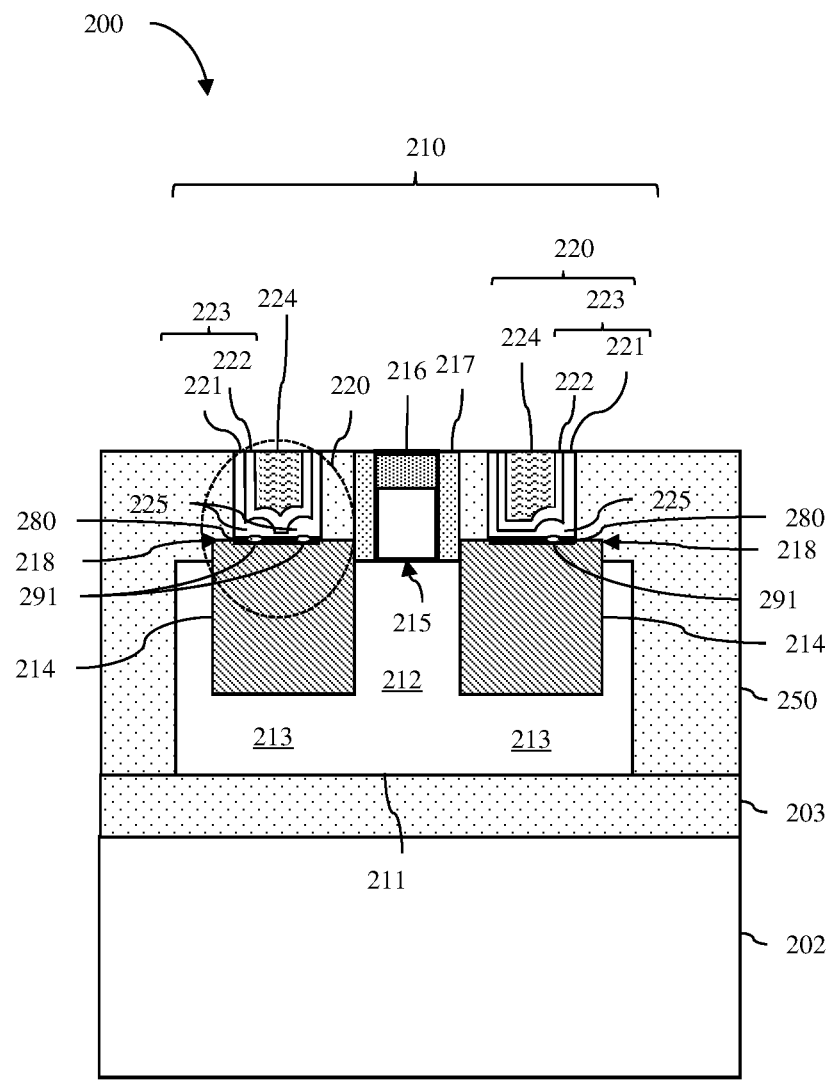
FIG. 9A is a cross-section diagram illustrating an integrated circuit structure formed according to the flow diagram of FIG. 1.
Figure 9B:
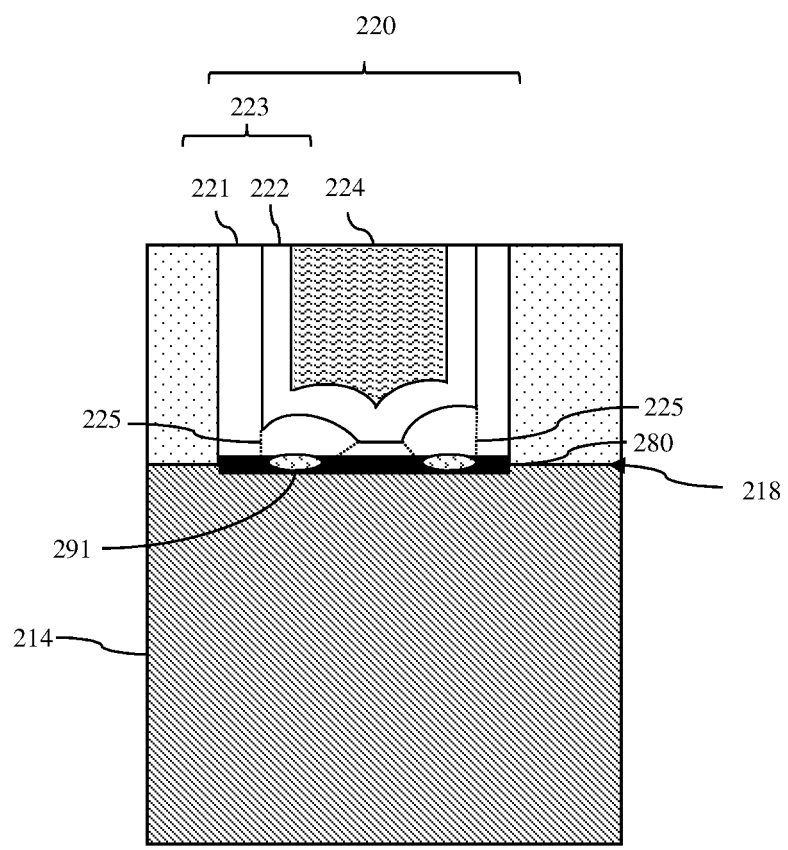
FIG. 9B is a cross-section diagram illustrating an enlarged view of a robust metal plug incorporated into the integrated circuit structure of FIG. 9A.

Next, a metal layer 224 can be deposited immediately adjacent to the second conformal layer 222 so as to fill the openings 230 and a polishing process (e.g., a chemical mechanical polishing (CMP) process) can be performed to remove any metal of the first conformal layer 221, the second conformal layer 222 and the metal layer 224 from above the top surface of the ILD layer 250, thereby completing the metal plugs 220 (120-122, see FIG. 9A and the enlarged view of a single metal plug 220 in FIG. 9B). The metal layer 224 can be, for example, a tungsten layer. Such a tungsten layer can be deposited by chemical vapor deposition (CVD) using a tungsten hexafluoride gas. Alternatively, the metal layer 224 can be made of any other metal suitable for use in metal plugs (e.g., copper, aluminum, cobalt, etc.). In any case, prevention of the microcracks in the second conformal layer 222, as mentioned above, prevents metal from the metal layer 224 from protruding into the area between the first conformal layer 221 and the second conformal layer 222 of the multi-layer liner 223 and/or from protruding completely through the multi-layer liner 223 to the semiconductor device surface 218. Furthermore, in the case of tungsten deposition, prevention of the microcracks in the second conformal layer 222, also prevents the material (e.g., titanium) of the first conformal layer 221 from being exposed to tungsten hexafluoride gas and, thus, prevents a reaction that could otherwise erode away the first conformal layer 221 and leave voids, within which tungsten deposits could form, in the area between the first conformal layer 221 and the second conformal layer 222 of the multi-layer liner 223 and/or below the multi-layer liner 223.

Referring to FIGS. 9A and 9B, also disclosed herein is an integrated circuit (IC) structure 200 with at least one robust middle of the line (MOL) contact and, particularly, at least one robust metal plug 220. The IC device 200 can include at least one semiconductor device 210 on a semiconductor wafer.

The semiconductor wafer can be, for example, a semiconductor-on-insulator wafer (e.g., a silicon-on-insulator (SOI) wafer) that includes a substrate 202 (e.g., a silicon substrate), an insulator layer 203 (e.g., a buried oxide (BOX) layer or other suitable insulator layer on the semiconductor substrate) and a semiconductor layer (e.g., a silicon layer or other suitable semiconductor layer) on the insulator layer 203. Alternatively, the semiconductor wafer can be a bulk semiconductor wafer (e.g., a bulk silicon wafer or other suitable bulk semiconductor wafer).

The semiconductor device 210 can be a field effect transistor (FET), a bipolar junction transistor (BJT), a heterojunction bipolar transistor (HBT), a diode, a capacitor, a resistor, or any other semiconductor device with at least one semiconductor device surface contacted by a metal plug 220. For purposes of illustration, the semiconductor device is described below and illustrated in the FIG. 9A as a FET and, particularly, as a non-planar FET, such as a fin-type FET (i.e., a FINFET).

Generally, a FINFET can include a semiconductor fin 211 (i.e., an elongated essentially rectangular shaped semiconductor body). A FINFET can further include the following: a channel region 212 within the semiconductor fin 211; a gate 215 adjacent to the semiconductor fin 211 at the channel region 212; a dielectric gate cap 216 above the gate 215; a dielectric gate sidewall spacer 217 positioned laterally adjacent to the sidewalls of the gate 215; and source/drain regions 214, which are within portions 213 of the semiconductor fin 211 that extend laterally beyond the gate 215 such that the channel region 212 is positioned laterally between the source/drain regions 214. The gate can be a gate first gate structure or a replacement metal gate structure. Optionally, the source/drain regions 214 can be raised epitaxial source/drain regions. That is, the semiconductor fin 211 can further have source/drain trenches on opposing sides of the channel region 212 and the source/drain trenches can be filled with an epitaxial semiconductor material. The epitaxial semiconductor material can be a different semiconductor material than that used for the semiconductor fin. For example, both the semiconductor material of the semiconductor fin 211 and the epitaxial semiconductor material of the raised epitaxial source/drain regions 214 can be silicon-based semiconductor materials, but they can be different silicon-based semiconductor materials. For example, the semiconductor material of the semiconductor fin 211 can be silicon and the epitaxial semiconductor material of the raised epitaxial source/drain regions 214 can be silicon germanium (e.g., for a p-type FET) or silicon carbide (e.g., for an n-type FET). Various configurations for FETs and FINFETs are well known in the art and, thus, the details of these configurations have been omitted from this specification in order to allow the reader to focus on the salient aspects of the disclosed structures.

The IC structure 200 can further include an interlayer dielectric (ILD) layer 250, which covers the semiconductor device 210. The ILD layer 250 can be, for example, a blanket silicon dioxide layer or a blanket layer of some other suitable ILD material, such as borophosphosilicate glass (BPS G), tetraethyl orthosilicate (TEOS), fluorinated tetraethyl orthosilicate (FTEOS), etc.

The IC structure 200 can further include at least one opening 230 that extends essentially vertically through the ILD layer 250 to a surface of the semiconductor device 210. For example, if the semiconductor device 210 is a FET, as illustrated, the IC structure 200 can further have a pair of openings 230 that extend essentially vertically through the ILD layer 250 to the top surfaces 218 of the raised epitaxial source/drain regions 214. A metal plug 220 can fill each opening 230.

Each metal plug 220 can include multiple layers. The layers can include a silicide layer 280, a first conformal layer 221, a second conformal layer 222 and a metal layer 224.

Specifically, each metal plug 220 can include a first conformal layer 221. The first conformal layer 221 can be a conformal metal layer. In a preferred embodiment, the first conformal layer 221 can be a conformal titanium layer. Alternatively, the first conformal layer 221 could be a conformal tantalum layer, a conformal ruthenium layer, or a conformal cobalt layer. It should be noted that this first conformal layer 221 will be above and immediately adjacent to any areas of contaminate residue 291 (e.g., fluoride residue) present on the semiconductor device surfaces 218 at the bottom of the openings 230. Furthermore, because a chemical reaction can occur during processing between the material of the first conformal layer 221 and material of contaminate residue 291, the first conformal layer 221 can have bumps 225 (e.g., relatively thick portions), wherein the bump(s) 225 are aligned above the contaminate residue 291, are laterally surrounded by thin portions(s) and are made of a compound of the material of the first conformal layer (e.g., a metal) and the material of the contaminate residue (e.g., a fluoride residue). For example, because a chemical reaction can occur during processing between titanium and fluoride during an anneal process, a titanium conformal layer can have bumps 225, which are relatively thick regions of titanium trifluoride, aligned above the areas on the semiconductor device surface 218 with the fluoride residue.

Each metal plug 220 can further include a silicide layer 280 at the interface between the semiconductor device surface 218 and the first conformal layer 221. For example, when the first conformal layer 221 is a conformal titanium layer, this silicide layer 280 will be a titanium silicide layer. If the first conformal layer 221 is a conformal tantalum layer, this silicide layer 280 will be a tantalum silicide layer, and so on.

Each metal plug 220 can further include a second conformal layer 222 immediately adjacent to the first conformal layer 221 and, thus, a multi-layer liner 223 and, particularly, a two-layer liner. The second conformal layer 222 can be, for example, a conformal barrier layer. In a preferred embodiment, the second conformal layer 221 can be a conformal titanium nitride layer. Alternatively, the second conformal layer 222 could be a conformal tantalum nitride layer, a conformal tungsten nitride layer, or any other conformal layer of a suitable barrier material.

Each metal plug 220 can further include a metal layer 224 immediately adjacent to the second conformal layer 222 and filling the opening 230. The metal layer 224 can be, for example, a tungsten layer. Alternatively, the metal layer 224 can be made of any other metal suitable for use in metal plugs (e.g., copper, aluminum, cobalt, etc.).

Since, as discussed above with regard to the method, the second conformal layer 222 is formed only after a silicidation anneal is performed, the second conformal layer 222 will remain essentially devoid of microcracks. That is, the second conformal layer 222 will be essentially crack-free. Thus, the second conformal layer 222 in the IC structure 200 provides a robust barrier between the metal layer 224 and the first conformal layer 221. As a result, the area between the first conformal layer 221 and the second conformal layer 222 of the multi-layer liner 223 and/or below the multi-layer liner 223 will remain devoid of metal depositions (e.g., devoid of tungsten deposits).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). As used herein, the phrase "positioned laterally" refers to an element be positioned to one side of another element as opposed to above or below the other element as they are oriented in the drawings. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming an opening that extends through an interlayer dielectric layer to a semiconductor device surface;
    depositing a first conformal layer to line the opening, the first conformal layer being immediately adjacent to the semiconductor device surface at a bottom of the opening;
    performing an anneal process, wherein the anneal process creates a silicide layer at an interface between the semiconductor device surface and the first conformal layer;
    after the performing of the anneal process that creates the silicide layer, depositing a second conformal layer immediately adjacent to the first conformal layer to form a multi-layer liner in the opening, wherein the second conformal layer comprises a conformal barrier layer; and,
    depositing a metal layer immediately adjacent to the second conformal layer of the multi-layer liner to fill the opening.

2. The method of claim 1, further comprising, after the depositing of the metal layer, performing a polishing process to remove the metal layer, the second conformal layer and the first conformal layer from above the interlayer dielectric layer.

3. The method of claim 1, further comprising,
    before the depositing of the first conformal layer, performing a surface treatment that leaves a contaminate residue on an area of the semiconductor device surface,
    the first conformal layer covering and being immediately adjacent to the contaminate residue,
    the first conformal layer reacting with the contaminate residue during the anneal process such that a portion of the first conformal layer, which is aligned above the contaminate residue, becomes relatively thick, creating a bump in the first conformal layer, and
    the second conformal layer being deposited after the anneal process to avoid microcrack formation in the second conformal layer above the bump during the anneal process.

4. The method of claim 3, the contaminate residue comprising a fluoride residue.

5. The method of claim 1, the first conformal layer comprising any of titanium, tantalum, ruthenium and cobalt, the second conformal layer comprising any of titanium nitride, tantalum nitride and tungsten nitride and the metal layer comprising any of tungsten, copper, aluminum, and cobalt.

6. The method of claim 1, the semiconductor device surface comprising a silicon-based semiconductor material and the first conformal layer comprising a conformal metal layer.

7. The method of claim 1, the anneal process comprising a laser anneal process performed in an inert gas environment to remove any oxide material formed on the first conformal layer.

8. The method of claim 7, the inert gas environment comprising any of a nitrogen gas environment and an argon gas environment.

9. A method comprising:
    forming an opening that extends through an interlayer dielectric layer to a top surface of a source/drain region of a field effect transistor, the source/drain region comprising a silicon-based semiconductor material;
    depositing a first conformal layer to line the opening, the first conformal layer comprising a titanium layer and the titanium layer being immediately adjacent to the top surface of the source/drain region at a bottom of the opening;
    performing an anneal process, the anneal process creating a titanium silicide layer at an interface between the source/drain region and the titanium layer;
    after the performing of the anneal process that creates the titanium silicide layer, depositing a second conformal layer immediately adjacent to the first conformal layer to form a multi-layer liner in the opening, wherein the second conformal layer comprises a conformal barrier layer; and, depositing a metal layer immediately adjacent to the second conformal layer of the multi-layer liner to fill the opening.

10. The method of claim 9, further comprising, after the depositing of the metal layer, performing a polishing process to remove the metal layer, the second conformal layer and the first conformal layer from above the interlayer dielectric layer.

11. The method of claim 9, further comprising, before the titanium layer is deposited, performing at least one surface treatment that leaves a fluoride residue on an area of the source/drain region, the titanium layer covering and being immediately adjacent to the fluoride residue, the titanium layer reacting with the fluoride residue during the anneal process such that a portion of the first conformal layer, which is aligned above the fluoride residue, becomes titanium trifluoride and relatively thick, creating a bump in the titanium layer, and the second conformal layer being deposited after the anneal process to avoid microcrack formation in the second conformal layer above the bump.

12. The method of claim 11, the at least one surface treatment comprising any of the following:

a tetrafluoromethane plasma etch process; and a nitrogen trifluoride plasma etch process.

13. The method of claim 9, the second conformal layer comprising any of titanium nitride, tantalum nitride and tungsten nitride and the metal layer comprising any of tungsten, copper, and cobalt.

14. The method of claim 9, the anneal process comprising a laser anneal process performed in an inert gas environment to remove any oxide material formed on the first conformal layer.

15. The method of claim 14, the inert gas comprising any of nitrogen and argon.

16. A method comprising:

forming an opening that extends through an interlayer dielectric layer to a semiconductor device surface;

depositing a conformal metal layer to line the opening, the conformal metal layer being immediately adjacent to a silicon-based semiconductor device surface at a bottom of the opening;

performing an anneal process, wherein the anneal process creates a metal silicide layer at an interface between the semiconductor device surface and the conformal metal layer;

after the performing of the anneal process that creates the metal silicide layer, depositing a conformal barrier layer immediately adjacent to the conformal metal layer to form a multi-layer liner in the opening;

depositing a metal layer immediately adjacent to the conformal barrier layer of the multi-layer liner to fill the opening; and performing a polishing process to complete formation of a metal plug in the opening, wherein, during the anneal process, the conformal metal layer reacts with a contaminate residue on the silicon-based semiconductor device surface and, as a result, a portion of the conformal metal layer, which is aligned above the contaminate residue, becomes relatively thick, creating a bump in the conformal metal layer, and wherein the conformal barrier layer is deposited on the conformal metal layer over the bump only after the anneal process in order to prevent formation of microcracks in the conformal barrier layer due to stress on the conformal barrier layer caused by the bump and, thereby prevent formation of tungsten-filled voids between the conformal metal layer and the conformal barrier layer due to a chemical reaction occurring, during deposition of the metal layer, if gas is allowed to pass through the microcracks, eroding the conformal metal layer and leading to the tungsten-filled voids.

17. The method of claim 16, further comprising, before the depositing of the conformal metal layer, performing a surface treatment that leaves the contaminate residue on the semiconductor device surface, and the conformal metal layer being deposited so as to cover and be immediately adjacent to the contaminate residue.

18. The method of claim 17, wherein the surface treatment comprises a pre-cleaning etch treatment that removes any oxide material from the silicon-based semiconductor device surface.

19. The method of claim 18, wherein the pre-cleaning etch treatment is a dry chemical etch process using a nitrogen trifluoride/ammonium etchant, wherein the contaminate residue comprising a fluoride residue, wherein the anneal process comprises a laser anneal process performed in an inert gas environment to remove any oxide material from an exposed surface of the conformal metal layer, and wherein the inert gas environment comprises any of a nitrogen gas environment and an argon gas environment.

20. The method of claim 16, wherein the conformal metal layer comprises a conformal titanium layer, wherein the metal silicide layer comprises a titanium silicide layer, wherein the conformal barrier layer comprises a titanium nitride layer and wherein the metal layer comprises a tungsten layer.

* * * * *